United States Patent [19]

Smith et al.

[11] Patent Number: 5,374,585
[45] Date of Patent: Dec. 20, 1994

[54] PROCESS FOR FORMING FIELD ISOLATION

[75] Inventors: Bradley P. Smith; Thomas S. Kobayashi, both of Austin, Tex.

[73] Assignee: Motorola, Inc., Schaumburg, Ill.

[21] Appl. No.: 239,788

[22] Filed: May 9, 1994

[51] Int. Cl.⁵ .................................... H01L 21/76
[52] U.S. Cl. .................................... 437/69; 437/70; 437/974; 437/968; 148/DIG. 135
[58] Field of Search ............... 437/69, 70, 968, 974; 148/DIG. 135

[56] References Cited

U.S. PATENT DOCUMENTS

| | | | |
|---|---|---|---|
| 4,691,222 | 9/1987 | Cox | 357/50 |
| 4,743,566 | 5/1988 | Bastiaens et al. | 437/70 |
| 5,064,683 | 11/1991 | Poon et al. | 427/39 |
| 5,151,381 | 9/1992 | Liu et al. | 437/70 |
| 5,173,444 | 12/1992 | Kawamura | 437/69 |
| 5,196,367 | 3/1993 | Lu et al. | 437/70 |
| 5,246,537 | 9/1993 | Cooper et al. | 156/649 |
| 5,252,503 | 10/1993 | Pasch | 437/33 |
| 5,310,692 | 5/1994 | Chan et al. | 437/69 |
| 4,927,780 | 5/1990 | Roth et al. | 437/69 |

FOREIGN PATENT DOCUMENTS

| | | | |
|---|---|---|---|
| 0030738 | 3/1981 | Japan | 437/69 |
| 0031164 | 2/1982 | Japan | 437/69 |
| 0038241 | 2/1988 | Japan | 437/67 |
| 4-209534 | 7/1992 | Japan | H01L 21/302 |

*Primary Examiner*—Brian E. Hearn
*Assistant Examiner*—Trung Dang
*Attorney, Agent, or Firm*—George R. Meyer

[57] ABSTRACT

A field isolation region is formed by a thermal oxidation followed by a polishing step. In forming the field isolation region, an opening is formed within a nitride layer, but the substrate is not etched. The field isolation region is formed and extends above the opening in the nitride layer. After forming the field isolation region, the substrate is polished, such that the surfaces of the field isolation region and silicon nitride layer are co-planar. The process may be easily integrated into an existing process flow and still provides an integrated circuit having an acceptable field threshold voltage.

17 Claims, 2 Drawing Sheets

PROCESS FOR FORMING FIELD ISOLATION

FIELD OF THE INVENTION

The present invention relates to semiconductor devices, and in particular, to forming field isolation for semiconductor devices.

BACKGROUND OF THE INVENTION

Semiconductor devices are currently requiring more levels of interconnects as component densities within the devices increase. A conventional local oxidation of silicon (LOCOS) field isolation process may cause problems because the field isolation regions may have too much of a step height change that may make subsequent planarization steps required or more difficult. Other field isolation processes that are similar to LOCOS, such as sealed-interface local oxidation (SILO), poly buffered LOCOS (PBL), LOCOS processes having silicon or nitride spacers, and the like, have similar step height problems.

LOCOS-type field isolation processes may cause problems when subsequently patterning a layer to form a gate electrode because reflective notching may occur. The changes in topography between a substrate and LOCOS-type of field isolation regions cause light to reflect and form notches in a masking layer pattern used to form a gate electrode. The mask pattern may have a feature with a uniform width, but the pattern formed in the masking layer by that mask may have a width that narrows near the edge of a field isolation region because of the reflective notching. The pattern in the masking layer is transferred to the conductive layer when the conductive layer is etched to form the gate electrode. This differenge between the pattern of the mask and the gate electrode is undesired.

Other field isolation processes have been developed that require etching a semiconductor substrate. These other processes, including trench isolation, semi-recessed or fully-recessed LOCOS processes, sidewall-masked isolation (SWAMI), and the like, all require some type of substrate etch. Trenches in the substrate may not have uniform depths. Narrow trenches may not be formed to the same depth as wider trenches because the concentration of ions (of a plasma) is typically lower for the narrower trench. Therefore, narrow trenches will be shallower than wider trenches. This effect is called "lag." Another problem with a substrate etch is that typically an endpoint does not exist. The depth of the substrate trench may be variable both across a substrate and between substrates of the same lot. A lack of control for the substrate etch poses a problem for which no good solution exists.

SUMMARY OF THE INVENTION

The present invention includes a process for forming a field isolation region. The process comprises the steps of: forming a nitride layer over a primary surface of a semiconductor substrate, wherein the primary surface has a first topography; patterning the nitride layer to form a patterned nitride layer having a nitride layer opening; growing a field isolation region to a first thickness within the nitride layer opening; and polishing portions of the field isolation region and the patterned nitride layer. When the nitride layer is formed over the substrate, the primary surface has a first topography. The step of patterning the nitride layer does not etch the semiconductor substrate. Immediately prior to the step of growing the field isolation region, the primary surface still has the first topography, and after growing the field isolation region, the primary surface has a second topography that is different from the first topography. After the step of polishing, an exposed surface of the field isolation region is co-planar with an exposed surface of the patterned nitride layer. Also after the step of polishing, the field isolation region has a second thickness that is thinner than the first thickness.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawing, in which like references indicate similar elements, and in which.

DETAILED DESCRIPTION OF EMBODIMENTS

A field isolation region may be formed such that the surface of the field isolation region is parallel to the primary surface of a substrate at locations spaced away from the field isolation region. The field isolation region is formed by thermal oxidation and without a substrate etching step. The field isolation region is then polished using half the normal substrate holder pressure and twice the normal platen rotational velocity to achieve a field isolation region that is relatively flat and not gouged from the polishing. The present invention is better understood with the embodiments that are described in more detail below.

Forming and Polishing a Field Isolation Region

Figure 1:
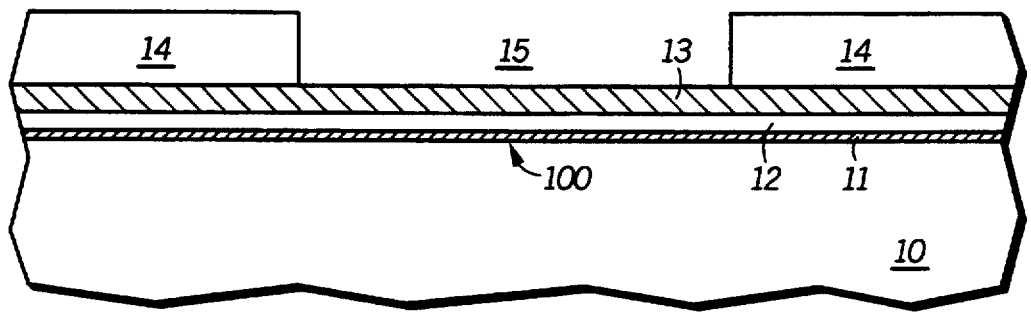
FIG. 1 includes a cross-sectional view of a portion of a semiconductor substrate after forming pad oxide, silicon, nitride, and masking layers.

FIG. 1 includes a cross-sectional view of a portion of a semiconductor substrate 10. The substrate 10 has a primary surface with a first topology 100. A pad dielectric layer 11 overlies the substrate 10, a silicon layer 12 overlies the pad dielectric layer 11, a silicon nitride layer 13 overlies the silicon layer 12, and a patterned masking layer 14 overlies the silicon nitride layer 13. The pad dielectric layer 11 may include one or more layers of an oxide, nitride, or nitrided oxide. The pad dielectric layer may be formed by thermal growth or deposition and has a thickness in a range of 100–500 angstroms. The silicon layer 12 may include polysilicon or amorphous silicon and has a thickness in a range of 300–800 angstroms. The silicon nitride layer 13 may be stoichiometric or non-stoichiometric, such as silicon-rich silicon nitride and nitrogen-rich silicon nitride. The silicon nitride layer 13 has a thickness in a range of about 800–2500 angstroms. The masking layer 14 includes an opening 15 that exposes a portion of the silicon nitride layer 13.

Figure 2:
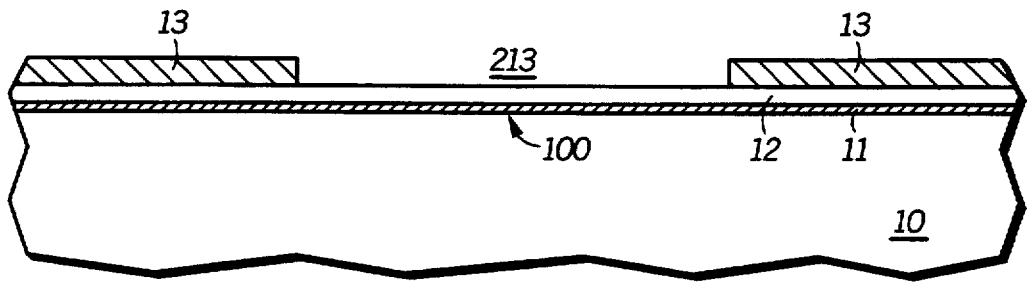
FIG. 2 includes a cross-sectional view of the substrate of FIG. 1 after patterning the nitride layer and removing the masking layer.

The exposed portion of the silicon nitride layer 13 is etched to form a nitride layer opening to 13 as shown in FIG. 2. In this embodiment, the etch is performed using a fluorine-containing etch chemistry, such as carbon tetrafluoride ($CF_4$), nitrogen trifluoride ($NF_3$), and the like. The etch is performed anisotropically and the opening 15 extends through the silicon nitride layer 13 but stops on silicon layer 12. After opening 15 is formed, the photoresist masking layer 14 is removed. In alternate embodiments, isotropic etching methods may be used.

Figure 3:
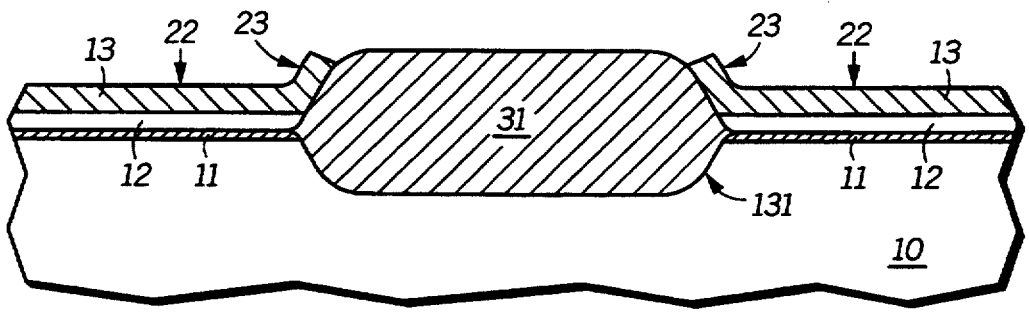
FIG. 3 includes a cross-sectional view of the substrate of FIG. 2 after forming a field isolation region.

A field isolation region 31 is formed from a portion of the silicon layer 12 and substrate 10 as shown in FIG. 3. The formation of the field isolation region 31 is performed by a thermal oxidation of a portion of the substrate 10, and the field isolation region 31 has a thickness as grown in a range of 1000–8000 angstroms. After formation of the field isolation region 31, the silicon nitride layer 13 includes two surface portions. Surface portions 22, lie away from the field isolation region 31, are relatively flat, and are parallel with those portions of the primary surface of the substrate 10 that underlies the surface portions 22. Surface portions 23 lie adjacent to the field isolation region 31 and are not flat but actually curve upward. After the field isolation region 31 is formed, the primary, surface of the substrate 10 now has a second topography 131. Note that the etch step in forming the nitride layer opening 213 does not change the topography of the primary surface of substrate 10. It is only after the field isolation region 31 is formed that the topography of the primary surface of substrate 10 is changed.

Figure 4:
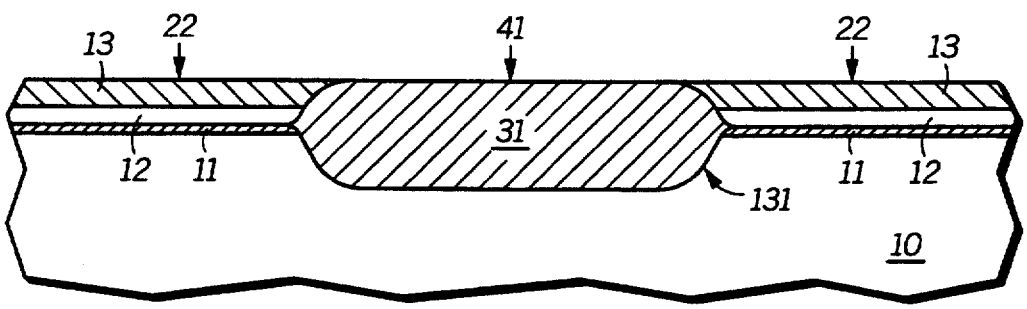
FIG. 4 includes a cross-sectional view of the substrate of FIG. 3 after polishing portions of the patterned nitride and field isolation region in accordance with an embodiment of the present invention.

The field isolation region 31 and part of the silicon nitride layer 13 are polished as shown in FIG. 4. The polishing is performed by chemical-mechanical polishing. During the polishing, it is desired to achieve a relatively flat surface. As seen in FIG. 4, the surface 41 of the field isolation region 31 and the surface portions 22 of the silicon nitride layer 13 are co-planar. The polishing is performed to remove a portion of the field isolation region 31 and the surface portions 23 of the silicon nitride layer 13. The surface portions 22 act as a polish stop. The polishing step may be determined by a significant increase in force needed to rotate the substrates or a step function decrease in the polishing rate of the field isolation region 31. Other methods may be used to detect the endpoint. In any event, the polishing should remove a relatively small portion of the silicon nitride layer 13 away from the field isolation region 31. The polishing step removes in a range of 100–3000 angstroms of the field isolation region 31. In one very specific embodiment, the field isolation region may be grown to a thickness of about 6500 angstroms, and the polishing step may remove about 1500 angstroms.

If conventional polishing parameters for polishing oxide layers were used, the field isolation region 31 would likely be gouged, and the process would not form the co-planar surfaces. To reduce the likelihood of gouging, the polishing is performed at a substrate holder pressure that is about half of the normal substrate holder pressure and at a platen rotational velocity that is about twice the normal platen rotational velocity. In this manner, the polishing rate remains about the same as the conventional process, but does not significantly gouge the field isolation region 31. The substrate holder pressure is in a range of about 21–34 kilopascals (about 3–5 pounds per square inch), and more specifically in a range of about 24–31 kilopascals (about 3.5–4.5 pounds per square inch). The platen rotational velocity is in a range of about 55–100 rotations per minute, and more specifically in a range of about 70–90 rotations per minute. Compare this with the conventional polishing of an oxide layer which is typically performed at a substrate holder pressure of about 48 kilopascals (7 pounds per square inch) and at a platen rotational velocity of 20–40 rotations per minute. The reduced substrate holder pressure of the embodiment previously described is less likely to cause gouging, and the increased platen rotational velocity helps to keep the polishing rate about the same as the conventional higher pressure polishing methods.

The polishing is performed with a polishing slurry that is typically basic and has a pH in a range of 9.5–10.0. The polishing slurry typically includes a hydroxyl chemical in an aqueous solution with particles. Examples of the hydroxyl chemical may include potassium hydroxide, ammonium hydroxide, or the like. The particles are typically silica particles but may also include or be replaced by alumina particles.

Figure 5:
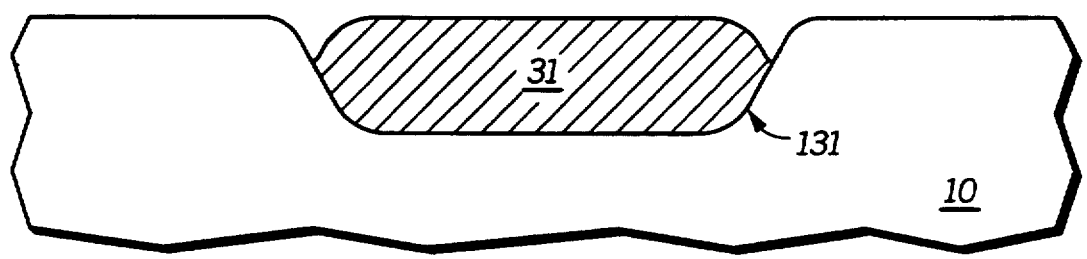
FIG. 5 includes a cross-sectional view of the substrate of FIG. 4 after removing all portions of the pad oxide, silicon, and patterned nitride layers that still remain over the substrate after polishing.

After the polishing step is completed, any and all remaining portions of the pad dielectric layer 11, the silicon layer 12 and the silicon nitride layer 13 are removed from the substrate. The substrate 10 and field isolation regions 31 at this point in the process is shown in FIG. 5. The removal of layers 11–13 may be performed by a dry or wet etching process. Below is an example of how the layers 11–13 are removed. Keep in mind that the example is for illustrative purposes and not meant to limit the present invention. Typically, a deglaze is performed after the formation of the field isolation region 31 to remove any oxide that may have formed on or from the silicon nitride layer 13. The deglaze is generally kept as short as possible to remove a minimal amount of the field isolation region 31. The silicon nitride layer 13 may be removed by a hot phosphoric acid solution. The silicon layer 12 may be removed in a dry etching process by using a fluorine-containing etch chemistry or a bromine-containing etch chemistry. The pad dielectric layer 11 may is typically removed using a hydrofluoric acid solution.

At this point in the processing, conventional metal oxide semiconductor, bipolar or other semiconductor processing may be performed. In many instances a sacrificial oxide may be grown and removed from the substrate 10 prior to forming a gate dielectric layer (not shown) or other subsequent layers (not shown). These processing sequences in considerations are known to those skilled in the art.

Figure 6:
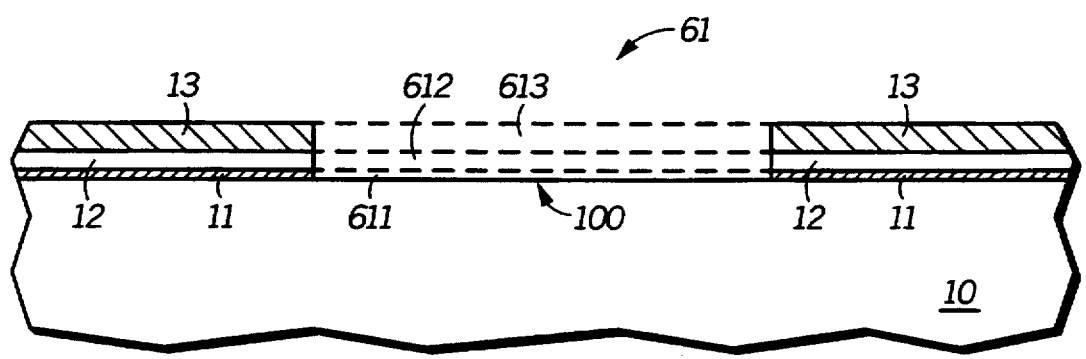
FIG. 6 includes a cross-sectional view of the substrate of FIG. 1 after patterning the pad oxide, silicon, and nitride layers and removing the masking layer.

In an alternative embodiment, openings may be formed that extend to the semiconductor substrate 10 before the field isolation region 31 is formed, as shown in FIG. 6. More specifically, an opening 61 actually includes three sections. The opening 61 includes a silicon nitride layer opening 613 adjacent to the silicon nitride layer 13, a silicon layer opening 612 adjacent to the silicon layer 12, and a pad dielectric layer opening 611 adjacent to the pad dielectric layer 11. Still, in this embodiment, the etch to form opening 61 is not performed to significantly etch into the semiconductor substrate 10. Therefore, the primary surface of the substrate 10 substantially retains its first topography 100. In still another alternative embodiment, the silicon layer 12 and silicon nitride layers 13 are both patterned but the pad dielectric layer 11 is not.

Benefits

Many benefits are seen with the embodiments of the present invention. The embodiments of the present invention may reduce reflective notching that can be seen at later processing steps. Referring to FIG. 5 for example, a gate dielectric layer may be formed over the exposed portions of the substrate 10 that are adjacent to the field isolation region 31. A conductive layer that may include silicon or a metal-containing material is formed over the gate dielectric layer. A masking layer is formed over the conductive layer and patterned using a lithographic mask. After forming the masking layer, the conductive layer is etched to form a gate electrode.

As previously discussed, reflective notching may occur during the formation of a gate electrode when a conventional LOCOS field isolation processing sequence is used. The embodiments of the present invention reduce the likelihood of reflective notching because of smaller topography changes. With less reflective notching, the pattern of the gate electrode should be more like the mask pattern. If the feature on the mask has a uniform width, the gate electrode should also have a uniform width.

The embodiments previously described include no etch of the semiconductor substrate 10. The prior art problems of lag and no endpoint are avoided. The present invention does not include this substrate etch, and therefore, should not have the non-uniform substrate etching that may occur with trench isolation, fully-recessed LOCOS or semi-recessed LOCOS.

The embodiments previously described may reduce dishing (also called gouging), which is dependent on the width of the features (field isolation regions). With a conventional polishing process, dishing occurs to a greater extent with wider field isolation regions compared to narrow field isolation regions. Still, dishing does occur with narrow field isolation regions. The embodiments of the present invention reduce the effects of dishing because the substrate holder pressure is kept relatively low and the platen rotational velocity is kept relatively high.

Depths of subsequently formed contact openings should be more uniform with the embodiments of the present invention compared to a conventional LOCOS process. The step height difference between a gate electrode and the substrate should be less with the embodiments of the present invention. Less step height difference generally means that the contact openings, which are formed within a subsequently formed insulating layer over the substrate and gate electrode, have less difference in depth between contact openings formed to the substrate and contact openings formed to the gate electrode. Contact etch and metalization processing sequences may be simpler for embodiments of the present invention compared to the conventional LOCOS processes.

Another benefit of the embodiments previously described is the ease of simplicity for integrating the process into an existing process flow. This process may be used with virtually all types of LOCOS processes, such as conventional LOCOS, sealed interface local oxidation (SILO), poly-buffered LOCOS (PBL), polysilicon-encapsulated LOCOS (PELOX), or types of LOCOS field isolation processes that include forming spacers within the silicon nitride layer opening. Those spacers may include nitride, oxide or polysilicon.

The embodiments of the present invention may be used without causing a problem with the field threshold voltage of an integrated circuit. A substrate that has not been polished and has a PBL type of LOCOS (similar to the one shown in FIG. 3) may have field threshold voltage of about 14 volts. The field isolation region 31 polished in accordance with the embodiments previously described may have a field threshold voltage of about 11.5 volts. Although a reduction occurs in the field threshold voltage, the field threshold voltage is typically greater than the 5 volts, which is typically the highest potential used in many logic and random access memory devices. Other electrical perimeters, such as the short channel breakdown voltages and the like, may not be significantly affected by the polishing of the substrate.

In the embodiments described above, field or channel-stop doping steps were omitted. Field or channel-stop doping is typically performed by ion implantation and may be performed: 1) prior to forming the field isolation region 31; 2) after forming the field isolation region 31 but before polishing; or 3) after polishing. Field or channel-stop implantation performed prior to forming the field isolation region 31 are performed using parameters of a conventional pre-field isolation region doping step. If the implantation is performed between forming of the field isolation region 31 and polishing, a higher energy will be used compared to an implantation performed after the polishing step. The difference in implanting energy is related to the thickness of the field isolation region 31 at the time of implanting. The energy for the implant should be targeted to have a projected range just below the field isolation region 31. Because the field isolation region 31 is thicker before it is polishing, a higher implanting energy is required. Other than implanting energy, the implanting parameters are about the same for both post-field isolation region doping processes. Implanting concerns with field isolation regions are known to those skilled in the art.

In the foregoing specification, the invention has been described with reference to specific embodiments thereof. However, it will be evident that various modifications and changes can be made thereto without departing from the broader spirit or scope of the invention as set forth in the appended claims. Accordingly, the specification and drawings are to be regarded in an illustrative rather than a restrictive sense.

What is claimed is:

1. A process for forming a field isolation region comprising the steps of:
   forming a nitride layer over a primary surface of a semiconductor substrate, wherein the primary surface has a first topography;
   patterning the nitride layer to form a patterned nitride layer having a nitride layer opening, wherein this step does not etch the semiconductor substrate;
   growing a field isolation region to a first thickness within the nitride layer opening, wherein:
      immediately prior to the step of growing the field isolation region, the primary surface has the first topography; and
      after growing the field isolation region, the primary surface has a second topography that is different from the first topography; and polishing a portion of the field isolation region and the patterned nitride layer, wherein after this step:
an exposed surface of the field isolation region is co-planar with an exposed surface of the patterned nitride layer; and
the field isolation region has a second thickness that is thinner than the first thickness.

2. The process of claim 1, further comprising steps of:
forming a pad oxide layer over the primary surface of the a semiconductor substrate; and
forming a silicon layer over the pad oxide layer prior to forming a nitride layer.

3. The process of claim 2, further comprising a step of:
patterning the silicon layer to form a silicon layer opening that underlies the nitride layer opening.

4. The process of claim 2, further comprising a step of removing all portions of the silicon and patterned nitride layers that still overlie the substrate after the step of polishing.

5. The process of claim 1, wherein the first thickness is in a range of 1000–8000 angstroms.

6. The process of claim 1, wherein the second thickness is in a range of 100–3000 angstroms thinner than the first thickness.

7. The process of claim 1, wherein the step of polishing is performed at a substrate holder pressure in a range of 3–5 pounds per square inch and a platen rotational velocity in a range of 55–100 rotations per minute.

8. The process of claim 7, wherein the step of polishing is performed with a polishing solution including a hydroxide and silica particles, and the polishing solution has a pH in a range of 9.5–10.0.

9. The process of claim 1, wherein the step of polishing is performed at a substrate holder pressure in a range of 3.5–4.5 pounds per square inch and a platen rotational velocity in a range of 70–90 rotations per minute.

10. A process for forming a field isolation region comprising the steps of:
forming a pad oxide layer over a primary surface of a semiconductor substrate, wherein the primary surface has a first topography;
forming a silicon layer over the pad oxide layer;
forming a nitride layer over the silicon layer;
patterning the nitride layer to form a patterned nitride layer having a nitride layer opening, wherein this step does not etch the semiconductor substrate and the primary surface has the first topography;
growing a field isolation region to a first thickness within the nitride layer opening, wherein:
immediately prior to the step of growing the field isolation region, the primary surface has the first topography; and
after growing the field isolation region, the primary surface has a second topography that is different from the first topography; and
polishing a portion of the field isolation region and the patterned nitride layer, wherein after this step:
an exposed surface of the field isolation region is co-planar with an exposed surface of the patterned nitride layer; and
the field isolation region has a second thickness that is thinner than the first thickness.

11. The process of claim 10, further comprising a step of:
patterning the silicon layer to form a silicon layer opening that underlies the nitride layer opening.

12. The process of claim 10, wherein the first thickness is in a range of 1000–8000 angstroms.

13. The process of claim 10, wherein the second thickness is in a range of 100–3000 angstroms thinner than the first thickness.

14. The process of claim 10, wherein the step of polishing is performed at a substrate holder pressure in a range of 3–5 pounds per square inch and a platen rotational velocity in a range of 55–100 rotations per minute.

15. The process of claim 14, wherein the step of polishing is performed with a polishing solution including a hydroxide and silica particles, and the polishing solution has a pH in a range of 9.5–10.0.

16. The process of claim 10, wherein the step of polishing is performed at a substrate holder pressure in a range of 3.5–4.5 pounds per square inch and a platen rotational velocity in a range of 70–90 rotations per minute.

17. The process of claim 10, further comprising a step of removing all portions of the silicon and patterned nitride layers that still overlie the substrate after the step of polishing.

* * * * *

UNITED STATES PATENT AND TRADEMARK OFFICE
CERTIFICATE OF CORRECTION

PATENT NO. : 5,374,585
DATED : December 20, 1994
INVENTOR(S) : Bradley P. Smith; Thomas S. Kobayashi It is certified that error appears in the above-indentified patent and that said Letters Patent is hereby corrected as shown below:

Column 7, line 10, delete [a]

Signed and Sealed this

Sixteenth Day of September, 1997

Attest:

BRUCE LEHMAN

Attesting Officer

Commissioner of Patents and Trademarks